US012559834B2

(12) United States Patent
Rajagopalan et al.

(10) Patent No.: US 12,559,834 B2
(45) Date of Patent: Feb. 24, 2026

(54) THERMALLY STABLE METALLIC GLASS FILMS VIA STEEP COMPOSITIONAL GRADIENTS

(71) Applicants: Jagannathan Rajagopalan, Tempe, AZ (US); Rohit Berlia, Tempe, AZ (US)

(72) Inventors: Jagannathan Rajagopalan, Tempe, AZ (US); Rohit Berlia, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 303 days.

(21) Appl. No.: 18/318,096

(22) Filed: May 16, 2023

(65) Prior Publication Data

US 2023/0374653 A1     Nov. 23, 2023

Related U.S. Application Data

(60) Provisional application No. 63/344,833, filed on May 23, 2022.

(51) Int. Cl.
| | |
|---|---|
| *C23C 14/34* | (2006.01) |
| *C23C 14/14* | (2006.01) |
| *C23C 14/18* | (2006.01) |
| *C23C 14/54* | (2006.01) |

(52) U.S. Cl.
CPC .......... *C23C 14/3485* (2013.01); *C23C 14/14* (2013.01); *C23C 14/185* (2013.01); *C23C 14/54* (2013.01)

(58) Field of Classification Search
CPC ... C23C 14/3485; C23C 14/185; C23C 14/54; C23C 14/14
See application file for complete search history.

(56) References Cited

U.S. PATENT DOCUMENTS

| | | | |
|---|---|---|---|
| 8,529,712 B2 | 9/2013 | Demetriou et al. | |
| 9,970,079 B2 | 5/2018 | Poole et al. | |
| 11,053,151 B2 * | 7/2021 | Hata ...................... | C22C 45/00 |
| 2011/0114474 A1 * | 5/2011 | Bae ......................... | H01J 37/34 |
| | | | 204/192.15 |
| 2012/0280337 A1 * | 11/2012 | Cao ........................ | B82Y 40/00 |
| | | | 257/E29.323 |
| 2014/0272454 A1 * | 9/2014 | Zhang ................. | C03C 17/3644 |
| | | | 428/656 |

FOREIGN PATENT DOCUMENTS

| | | | | | |
|---|---|---|---|---|---|
| CN | 102800752 A | * | 11/2012 | | |
| CN | 113174575 A | * | 7/2021 | .......... | C23C 14/352 |
| JP | 2008155333 A | * | 7/2008 | | |

OTHER PUBLICATIONS

Translation to Song (CN 113174575) published Jul. 2021.*
(Continued)

*Primary Examiner* — John J Brayton
(74) *Attorney, Agent, or Firm* — SNELL & WILMER L.L.P

(57) ABSTRACT
A method to grow metallic glass films utilizes engineering steep, spatially modulated compositional gradients during physical vapor deposition. This method can be used to enhance the thermal stability (increase glass transition and crystallization temperature) of thin film metallic glasses or can be used to produce amorphous films of metallic alloys that do not readily form a glassy structure.

7 Claims, 6 Drawing Sheets

302 providing a first material and a second material to a sputtering system 304 simultaneously depositing the first material with a first applied power and the second material with a second applied power on a substrate 306 adjusting the first applied power and second applied power 308 re-adjusting the first applied power and the second applied power

(56)  References Cited

OTHER PUBLICATIONS

Yiu, P. et al., Thin film metallic glasses: Properties, applications and future. Journal of Applied Physics. 127, 030901 (2020).

Chu, J. P. et al., Thin film metallic glasses: Unique properties and potential applications. Thin Solid Films. 520, 5097-5122 (2012).

\* cited by examiner

THERMALLY STABLE METALLIC GLASS FILMS VIA STEEP COMPOSITIONAL GRADIENTS

CROSS-REFERENCE TO RELATED APPLICATIONS

This application claims priority to and the benefit of U.S. Provisional Patent Application No. 63/344,833, filed May 23, 2022, entitled "Thermally Stable Metallic Glass Films via Steep Periodic Compositional Gradients." The content of the foregoing application is hereby incorporated by reference (except for any subject matter disclaimers or disavowals, and except to the extent of any conflict with the disclosure of the present application, in which case the disclosure of the present application shall control).

TECHNICAL FIELD

The present disclosure relates to forming metallic films, and in particular to growing metallic glass films by engineering steep, spatially modulated compositional gradients during physical vapor deposition.

BACKGROUND

Metallic glass thin films, which have an amorphous structure, exhibit superior hardness, wear and corrosion resistance, and lower roughness compared to crystalline metallic films. These superior properties arise because of the lack of crystal defects and grain boundaries in metallic glass films. Metallic glass films have numerous applications in fields ranging from biomedical devices to semiconductors to cutting tools. However, only a limited number of metallic alloys with specific compositions can be deposited in amorphous form. In particular, barring a few exceptions (NiTi, TiAl, CuZr, ZrTi), it is not possible to form metallic glass films from binary alloys using conventional physical vapor deposition processes such as sputtering or evaporation. Moreover, even if metallic glass films can be deposited, they crystallize upon annealing at relatively low temperatures, which diminishes their properties. Therefore, it remains highly desirable to develop methods that can produce thermally stable metallic glass films.

SUMMARY

In various embodiments, a method for forming a metallic glass film may include providing a first material and a second material to a sputtering system. The method may include simultaneously depositing the first material with a first applied power and the second material with a second applied power on a substrate. The first applied power may be greater than the second applied power. The method may include adjusting the first applied power and second applied power. The adjusting the first applied power and second applied power may be by decreasing the first applied power and increasing the second applied power, wherein the second applied power is greater than the first applied power. The method may include re-adjusting the first applied power and the second applied power. The re-adjusting the first applied power and the second applied power may be by decreasing the second applied power and increasing the first applied power, wherein the first applied power is greater than the second applied power.

In various embodiments, a method for forming a metallic glass film may include loading a sputtering system with a target A and a target B. The method may include measuring the sputtering rate for each of target A and target B as a function of applied power. The method may include sputtering the target A and the target B to form a first layer of a film AB. The power applied to each of the targets may be chosen such that the composition of the deposited layer is A-rich. The method may include cycling the power applied to target A and target B, by reducing the power applied to target A and increasing the power applied to target B. The method may include sputtering the target A and the target B to form a second layer of the film AB, wherein the power applied to each of the targets is chosen such that the composition of the deposited layer is B-rich. The method may include reversing the power applied to target A and target B, by increasing the power applied to target A and decreasing the power applied to target B. The method may include repeating the steps of cycling the power applied to target A and target B, and reversing to cycle target A and target B, such that the composition of the deposited layer alternates from A-rich and B-rich until a desired film thickness is obtained.

The contents of this section are intended as a simplified introduction to the disclosure and are not intended to limit the scope of any claim.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the following illustrative figures. In the following figures, like reference numbers refer to similar elements and steps throughout the figures.

DETAILED DESCRIPTION

Figure 1A:
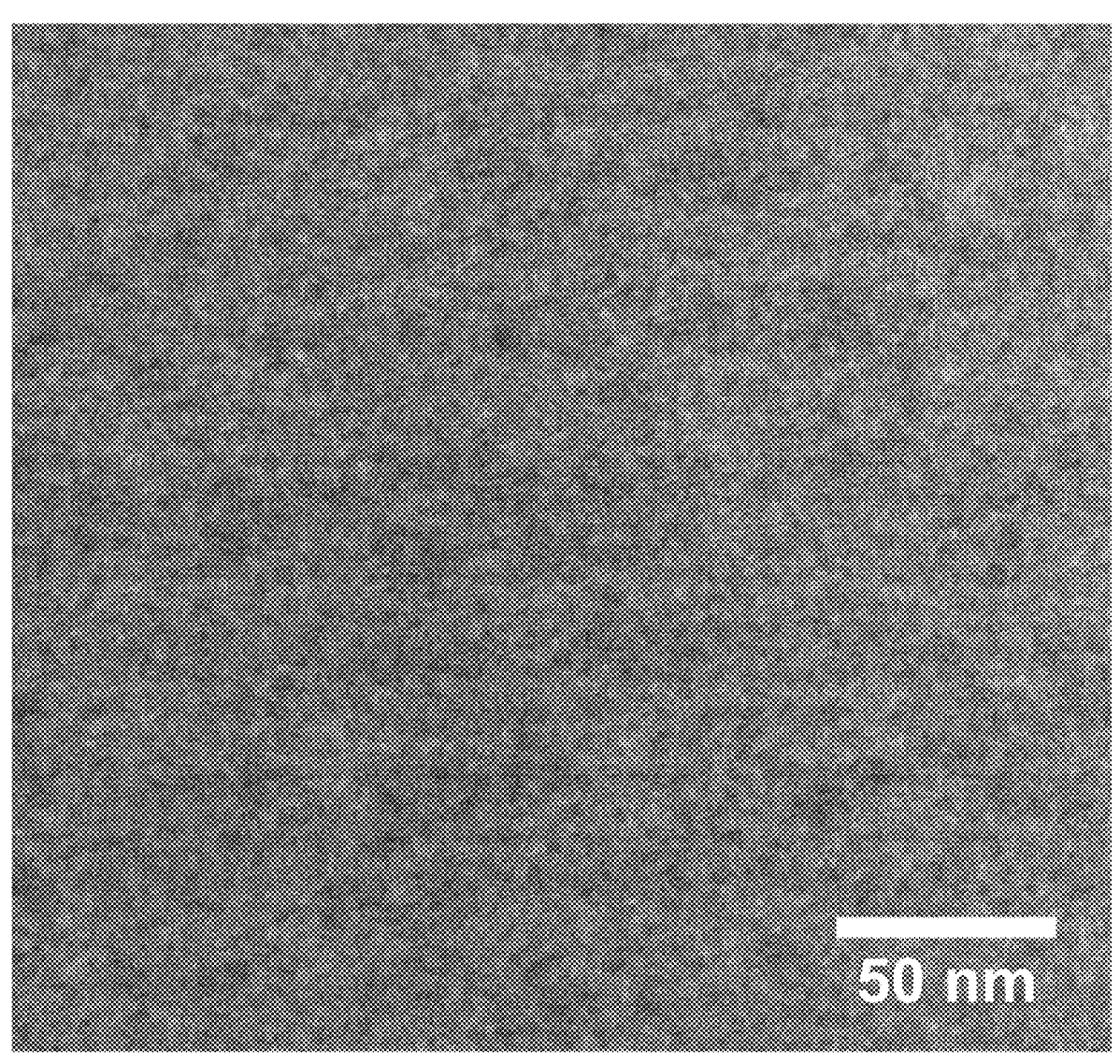
FIG. 1A illustrates a TEM bright-field image showing a metallic glass film, formed in accordance with various exemplary embodiments.

The following description is of various exemplary embodiments only, and is not intended to limit the scope, applicability, or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of the appended claims.

For the sake of brevity, conventional techniques for forming metallic films, materials deposition, thermal processing, microstructure creation, crystalline engineering, and/or the like may not be described in detail herein.

Furthermore, the connecting lines shown in various figures contained herein are intended to represent exemplary functional relationships and/or physical couplings between various elements. It should be noted that many alternative or additional functional relationships or physical connections may be present in a practical method for forming metallic films, related methods, and/or products arising therefrom.

Metallic glass films have superior hardness, wear and corrosion resistance and lower roughness compared to crystalline metallic films. These superior properties arise because of the lack of crystal defects and grain boundaries in metallic glass films. Metallic glass films have numerous applications in fields ranging from biomedical devices to semiconductors to cutting tools. However, only a limited number of metallic alloys with specific compositions can be deposited in amorphous form. In particular, barring a few exceptions (NiTi, TiAl, CuZr, ZrTi), it is not possible to form metallic glass films from binary alloys using conventional physical vapor deposition processes such as sputtering or evaporation. Moreover, even if metallic glass films can be deposited, they crystallize upon annealing at relatively low temperatures, which diminishes their properties. Therefore, there is a critical need to develop methods that can produce thermally stable metallic glass films.

The present disclosure concerns the synthesis of metallic glass films using physical vapor deposition methods such as sputtering. An exemplary synthesis method disclosed herein can be used to produce metallic glass films from alloys that do not readily form an amorphous (glassy) structure such as NiAl. It can also be used to increase the thermal stability (i.e., increase glass transition and crystallization temperature) of alloys that readily form a glassy structure, such as TiAl and NiTi. The exemplary method is applicable to both binary alloys, as well as alloys with three or more components, such as AlNiY, NiTiZr, CuZrAg, PdCuSi, ZrCuAlNi and AlCrMoSiTi.

Metallic glass films have higher strength, hardness, elastic limit and wear and corrosion resistance compared to crystalline metallic films. They also have lower roughness, friction coefficient, and surface energy. As a result, metallic glass films are used as corrosion and fatigue prevention coatings in structural materials, diffusion barriers in semiconductors, antibacterial and low friction coatings in biomedical devices, among other applications. While bulk metallic glasses are typically composed of three or more components, the disclosed method allows even two component alloys to be deposited as a metallic glass, which increases the choice of material systems and lowers the cost considerably.

The present disclosure concerns systems and methods for forming of thin films with sputtering. Exemplary systems and methods allow production of amorphous metallic alloy films, also referred to as metallic glasses, which have superior hardness, wear, corrosion resistance, and smoothness properties compared to crystalline films due to lack of crystal defects and grain boundaries. The present disclosure concerns system and methods for co-sputtering metals and forming steep, spatially modulated compositional gradients. The present disclosure concerns methods for forming binary AB alloy films that readily do not form amorphous films. Moreover, an exemplary method allows formation of metallic films that have increased thermal stability. For example, an exemplary method of forming metallic alloy films may be used to increase thermal stability of alloys such as NiTi, TiAl, ZrTi, and CuZr that naturally form amorphous thin films. The methods are applicable to a wide range of materials including metallic alloys, ceramics, and semiconductors.

At least three novel aspects distinguish the exemplary systems and methods in the present disclosure from existing technologies. First, the disclosed systems and methods use a unique method that enables alloys that resist glass formation, such as NiAl, to be deposited as a metallic glass film. Second, exemplary systems and methods can be used to increase the thermal stability of naturally glass forming alloys such as CuZr and NiTi. Third, by tuning the composition gradient, the thermal stability of the metallic glass films may be tailored.

There are several advantages of the systems and methods in the present disclosure over existing technologies. The disclosed systems and methods can be used to enhance thermal stability of thin film metallic glass or can be used to produce amorphous films of metallic alloys that do not readily form a glassy structure. The disclosed system and method concerns forming metallic glass films through engineering steep, spatially modulated compositional gradients during physical vapor deposition. Moreover, exemplary disclosed systems and methods are applicable to a broad range of materials including metallic alloys (ordered intermetallics, high entropy alloys, etc.), semiconductors and ceramics (oxides, nitrides, etc.).

The thin films fabricated using the disclosed systems and methods have applications in photovoltaics, MEMS sensors and actuators, thermal barrier systems, wear and corrosion resistant coatings, diffusion barriers/insulators in electronics, transparent electrodes in optoelectronics and optical coatings.

Figure 1B:
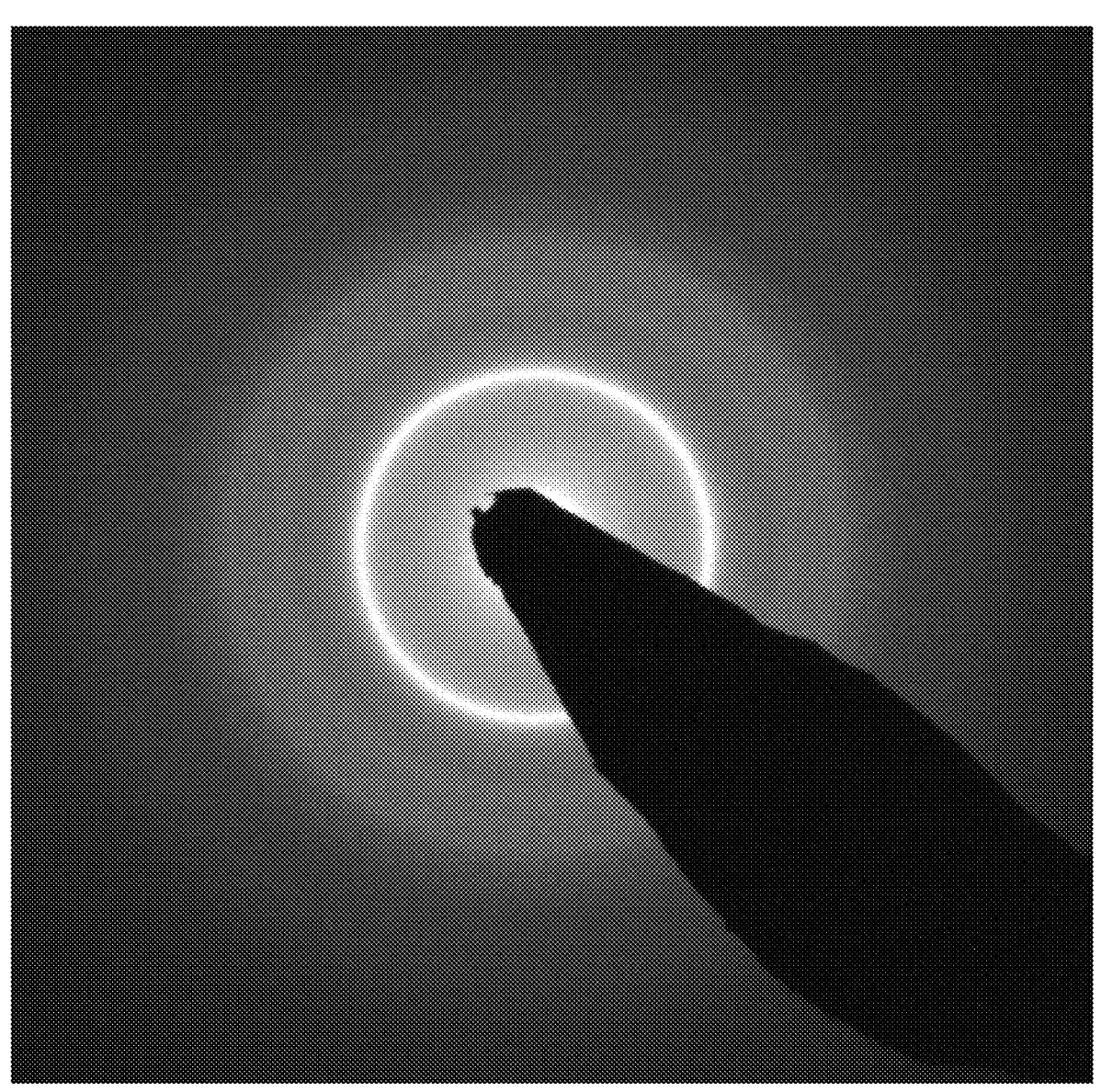
FIG. 1B illustrates a diffraction pattern of the film of FIG. 1A, in accordance with various exemplary embodiments.

With reference now to FIGS. 1A and 1B, in various exemplary embodiments, principles of the present disclosure contemplate a process for forming an amorphous metallic film, as shown. In various embodiments, a metallic glass film may be formed on a substrate by sputtering from a target A and a target B simultaneously. For example, a power may be applied to the system to sputter the target A and target B. Further, a cycling process may be used wherein an A-rich film composition is first deposited. An A-rich composition is, for example, a composition where the number of atoms of target A is greater than that of target B. In various embodiments, an A-rich composition may be deposited by applying a first power to target A and a second power to target B, wherein the resulting film composition has a greater composition of target A than target B. In various embodiments, a greater power may first be applied on target A compared to target B, so that the film composition is A-rich. The process may then alternate from an A-rich composition to a B-rich composition. A B-rich composition is, for example, a composition where the number of atoms of target B is greater than that of target A. In various embodiments, the process of alternating from an A-rich composition to a B-rich composition may comprise decreasing the power applied to target A and increasing the power applied to target B. In various embodiments, the power applied to target B may increase, so that the resulting composition is B-rich. In various embodiments, the power applied to target A may decrease and the power applied to target B may increase, so that the composition is B-rich. An exemplary process, in various embodiments, cycles the composition to create layers of various densities and chemical composition. The power applied to each of the target A and target B may be adjusted to create a desired chemical composition and thickness. For example, a first layer may be created wherein the initial composition of target A could be roughly 40%, and target B could be roughly 60%. In continuation of this example, the powers applied to target A and target B may vary, wherein the composition of target A may be roughly 15% and target B could be roughly 85%. In continuation of this example, the powers applied to target A and target B may vary, wherein the composition of target A increases to 40% and B reduces to 60%, and the cycling is continued. In various embodiments, the amount of target A may range from 0% to 100%. For example, the power to target A may be increased or decreased to increase or decrease the relative composition of target A. In various embodiments, the amount of target B applied may range from 0% to 100%. For example, the power to target B may be increased or decreased to increase or decrease the relative composition of target B. In various embodiments, the average composition of the film of target A is X % and the target B is Y %, wherein X+Y=100. In various embodiments, X may be increased as Y may be decreased. In various embodiments, Y may be increased as X may be decreased.

It will be appreciated that the gradient of target A and target B in a through-layer direction may vary in any suitable manner, for example in a linear manner, a sinusoidal manner, or the like. For example, in a particular example layer, the composition may comprise 85% target A and 15% target B at one side of the layer, varying linearly to 15% target A and 85% target B at the middle of the layer, and again varying linearly in the opposite direction back to 85% target A and 15% target B at the opposite side of the layer.

Moreover, it will be appreciated that adjacent layers may differ from one another in certain ways in order to achieve a desired microstructure. For example, adjacent layers may differ from one another in thickness (for example, a first layer may be 10 nm thick, a second layer may be 15 nm thick, and so forth). Moreover, adjacent layers may differ from one another in relative composition of targets A and B (for example, a first layer may vary from 40% to 60% target A and back again, while a second layer may vary from 85% to 15% target A and back again). Yet further, adjacent layers may differ from one another in gradient (for example, a first layer may have a linear gradient, and a second layer may have a sinusoidal gradient).

As shown in FIG. 1A, in various embodiments, an exemplary film formed in accordance with principles of the present disclosure may be composed of 10 layers. However, any suitable number of layers may be utilized, as desired. With continued reference to FIGS. 1A and 1B, a resulting film created from an exemplary deposition process may comprise target A of Ni and target B of Al. In the exemplary embodiment shown in FIG. 1A, the Al composition of the film varied from 80% to 20% to 80% and the NI composition of the film varied from 20% to 80% to 20% over each layer (12.5 nm thick). In various embodiments, the layers of film shown in FIG. 1A may be repeated until a desired thickness is obtained. For example, a desired thickness of 125 nm film may comprise 10 layers. The featureless microstructure shown in FIG. 1A, and the continuous ring-like diffraction pattern shown in FIG. 1B, confirms the amorphous nature of the film.

With continued reference to FIG. 1A, in various embodiments, an exemplary film may be approximately 125 nm thick. In various embodiments, the materials may be deposited by a suitable sputtering system, such as an AJA Orion 5, Orion 8, ATC 1800, or ATC 2200 sputtering system, or other suitable sputtering system. In various embodiments, the DC power applied to the Ni target may vary from approximately 50 watts to 125 watts. In various embodiments, the power applied may be in the form of DC power.

Further, in accordance with this exemplary embodiment, the DC power applied to Al target may vary from approximately 60 watts to 200 watts. In various embodiments, the power applied to each of the target materials may vary. For example, the powers applied to the materials may vary depending on whether the targets are new or partially consumed. In various embodiments, RF power sources may be applied to Ni and/or Al, wherein the targets may be 2 inches in diameter. In various embodiments, the deposition time for each 12.5 nm layer (total of 10 layers) may be approximately 2.5 minutes. It will be appreciated that various suitable power sources may be utilized in various embodiments, for example, direct current, alternating current, radio frequency, and/or the like.

Figure 2A:
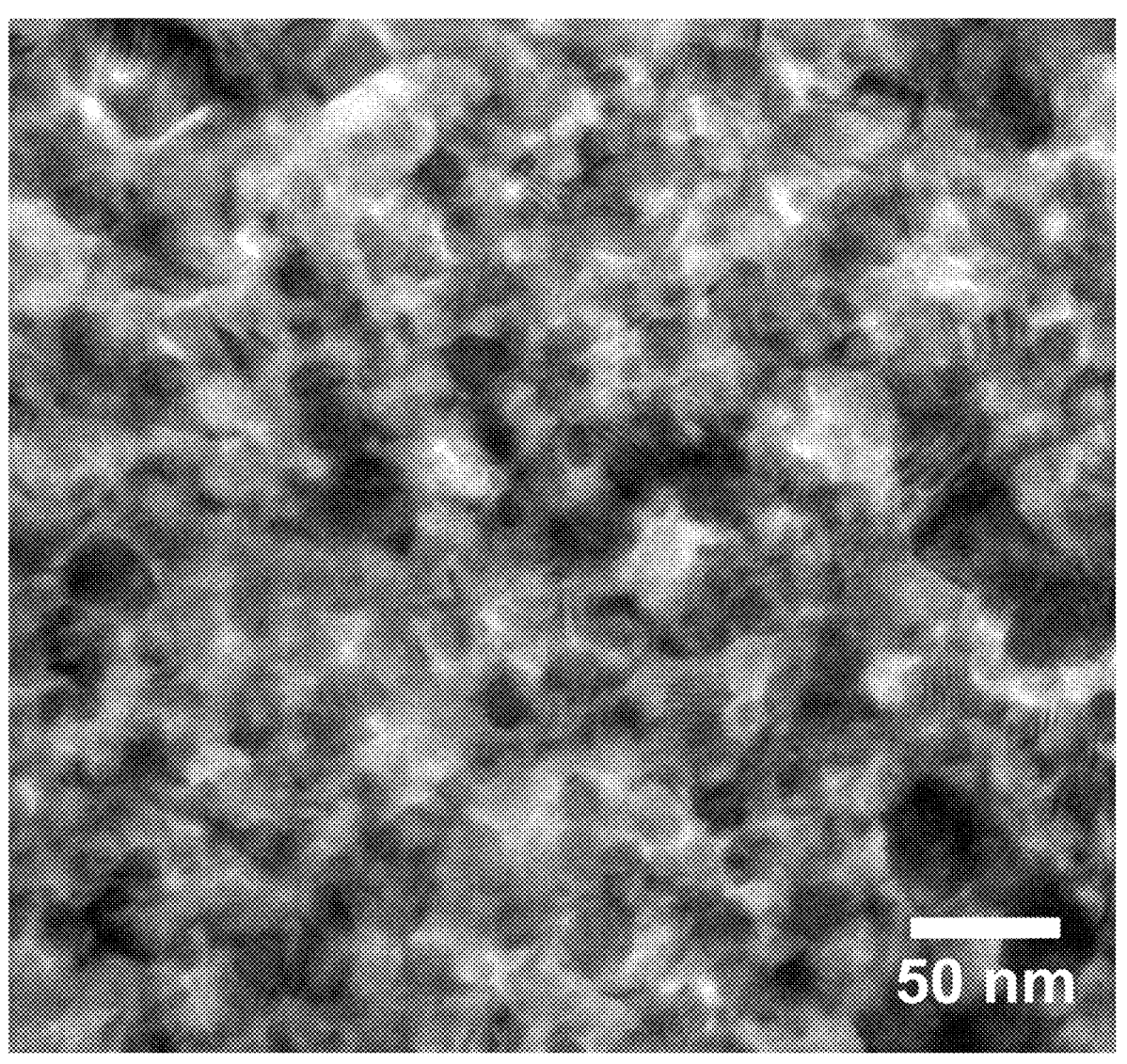
FIG. 2A illustrates a TEM bright-field image of a crystallized metallic glass film as the result of annealing the film illustrated in FIG. 1A, in accordance with various exemplary embodiments.
Figure 2B:
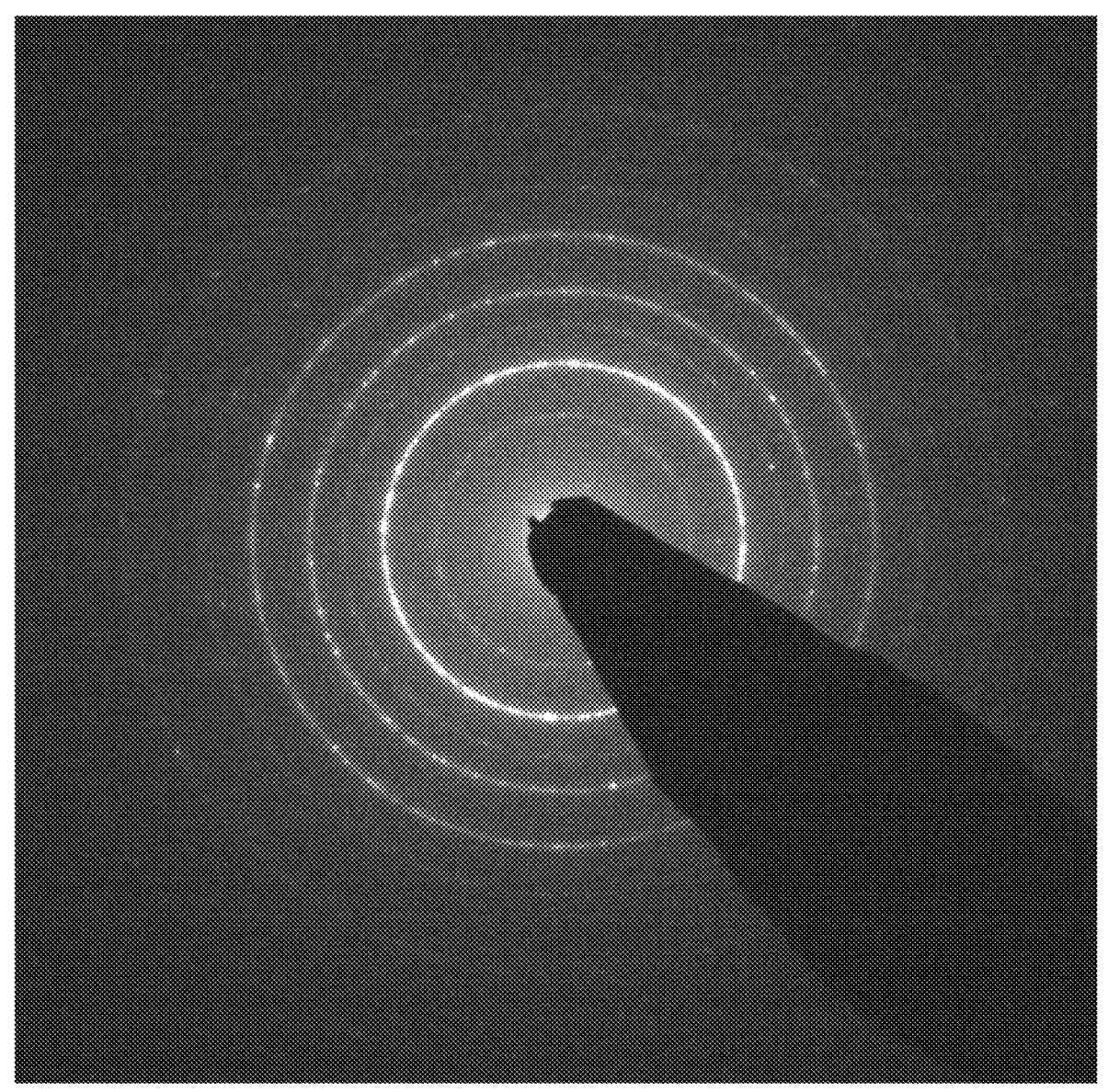
FIG. 2B illustrates a diffraction pattern of the film of FIG. 2A, in accordance with various exemplary embodiments.

With reference now to FIGS. 2A and 2B, in various embodiments, the metallic glass film may be annealed at a desired temperature. In FIG. 2, the metallic glass film of FIG. 1A has been annealed at a temperature of 400 degrees Celsius for two hours. Various temperatures may be used to anneal the metallic glass film for desired results. For example, the temperature used to anneal the films may range from about 250 degrees Celsius to about 400 degrees Celsius. Further, in various embodiments the time to anneal the film may range from 10 minutes to four hours. In various embodiments, any suitable time to anneal the film may be used to obtain desired results. The TEM bright-field image of FIG. 2A illustrates a deposited NiAl amorphous film that has been annealed, causing it to thermally convert or transform to a crystalline film. In accordance with various embodiments, the resulting film of FIGS. 2A and 2B illustrates proof of crystallization of an initially amorphous film.

Figure 3:
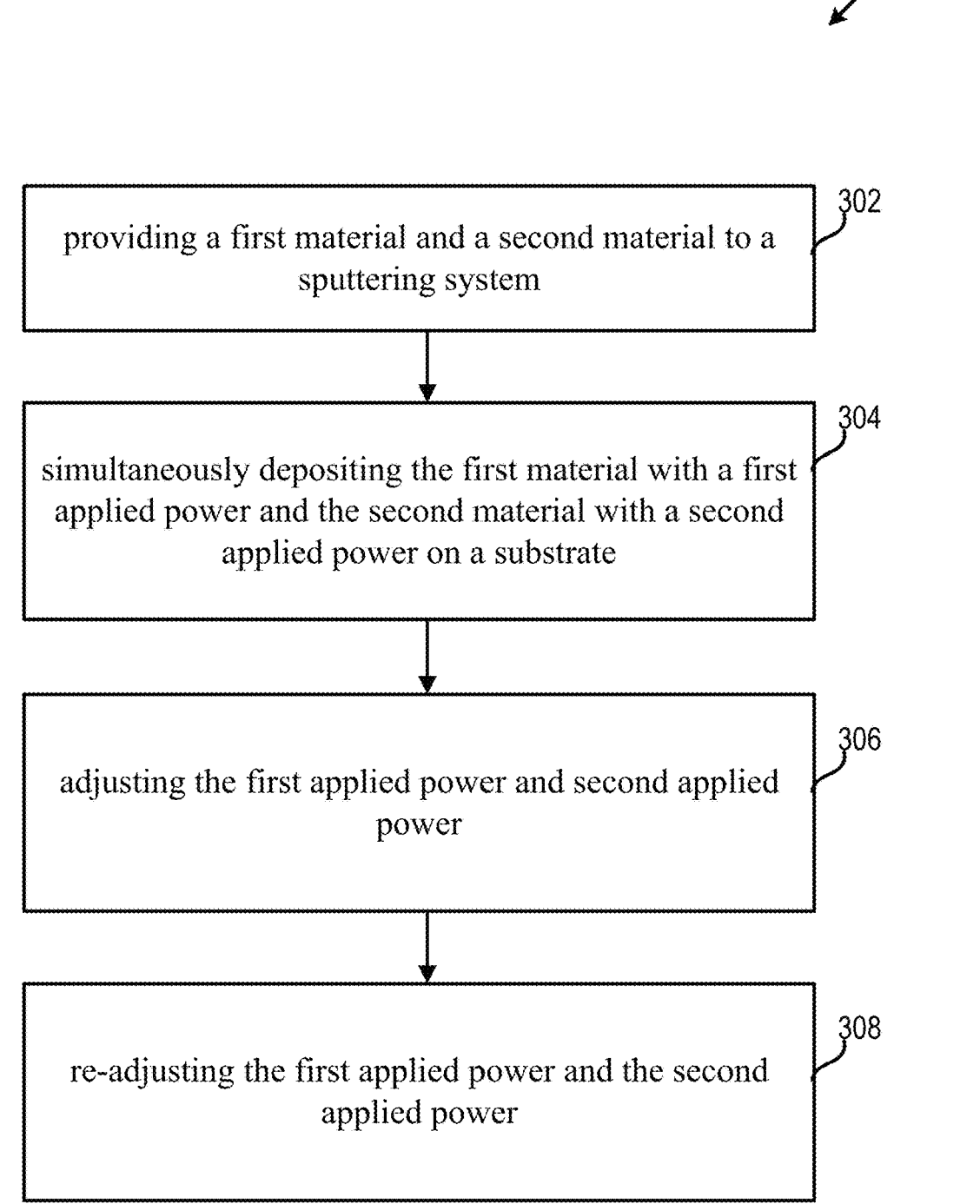
FIG. 3 is a flow chart of a method for forming a metallic glass film, in accordance with various embodiments.

With reference now to FIG. 3, a method 300 for forming a metallic glass film is illustrated. In various exemplary embodiments, method 300 comprises providing a first material and a second material to a sputtering system (step 302). Method 300 further comprises simultaneously depositing the first material with a first applied power and the second material with a second applied power on a substrate (step 304). In various embodiments, the first applied power may be greater than the second applied power. Method 300 further comprises adjusting the first applied power and second applied power (step 306). For example, the adjusting the first applied power and second applied power may be by decreasing the first applied power and increasing the second applied power, wherein the second applied power is greater than the first applied power. Method 300 further comprises re-adjusting the first applied power and the second applied power (step 308). For example, the re-adjusting the first applied power and the second applied power may be by decreasing the second applied power and increasing the first applied power, wherein the first applied power is greater than the second applied power.

Figure 4:
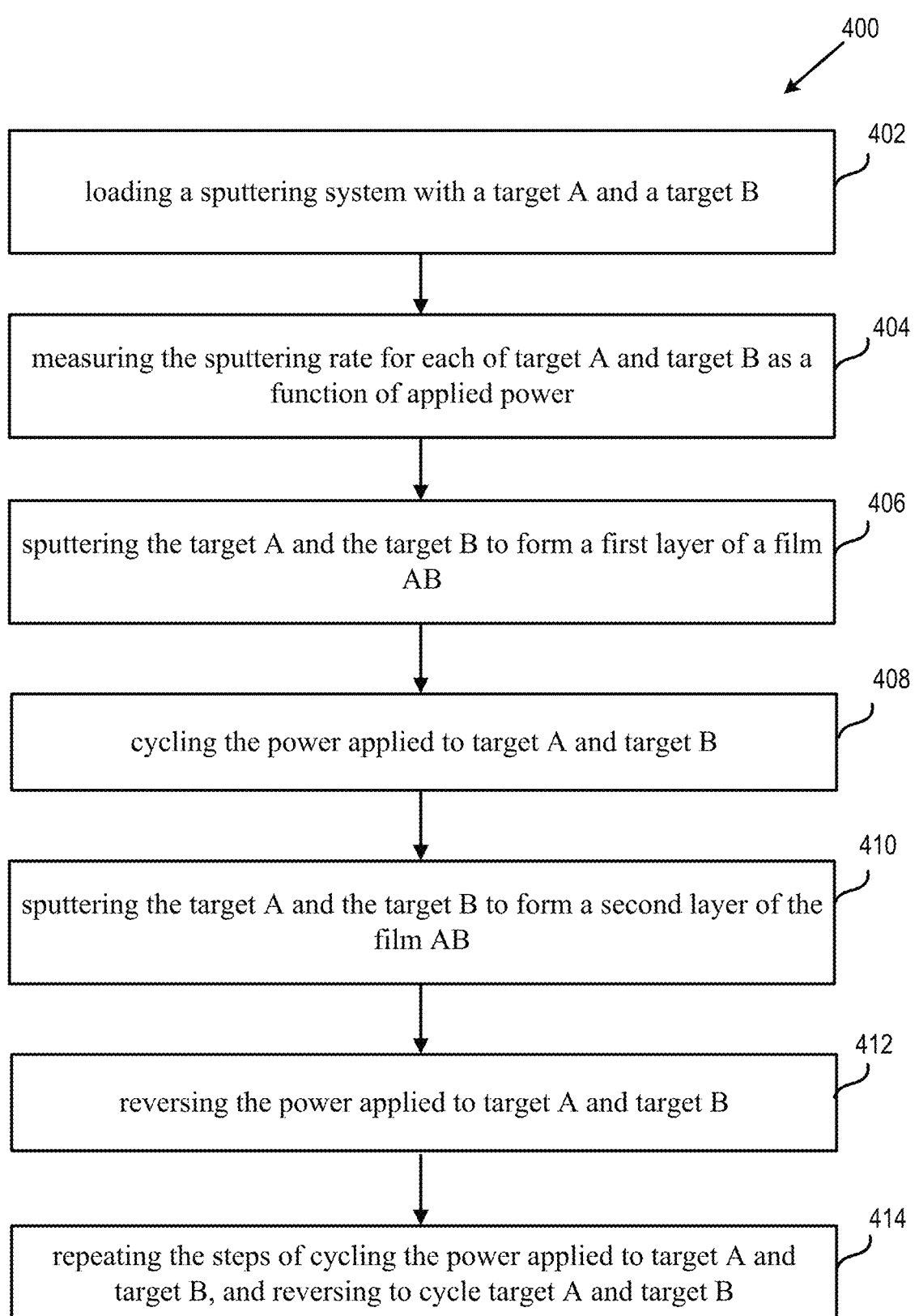
FIG. 4 is a flow chart of a method for forming a metallic glass film, in accordance with various embodiments.

With reference now to FIG. 4, a method 400 for forming a metallic glass film is shown. In various exemplary embodiments, method 400 comprises loading a sputtering system with a target A and a target B (step 402). Method 400 further comprises measuring the sputtering rate for each of target A and target B as a function of applied power (step 404). Method 400 further comprises sputtering the target A and the target B to form a first layer of a film AB (step 406). The power applied to each of the targets may be chosen such that the composition of the deposited layer is A-rich. Method 400 further comprises cycling the power applied to target A and target B (step 408). The cycling the power applied to target A and target B may be by reducing the power applied to target A and increasing the power applied to target B. Method 400 further comprises sputtering the target A and the target B to form a second layer of the film AB (step 410). The power applied to each of the targets may be chosen such that the composition of the deposited layer is B-rich. Method 400 further comprises reversing the power applied to target A and target B (step 412). The reversing the power applied to target A and target B may be by increasing the power applied to target A and decreasing the power applied to target B. Method 400 further comprises repeating the steps of cycling the power applied to target A and target B, and reversing to cycle target A and target B, such that the composition of the deposited layer alternates from A-rich and B-rich until a desired film thickness is obtained (step 414).

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure and may be expressed in the following claims.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection. When language similar to "at least one of A, B, or C" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A method of forming a metallic glass film, the method comprising:

providing a first target comprising a first material and a second target comprising a second material to a sputtering system, simultaneously depositing the first material with a first applied power and the second material with a second applied power on a substrate, wherein the first applied power is greater than the second applied power, wherein the first applied power is applied to the first target and the second applied power is applied to the second target;

adjusting the first applied power and the second applied power, by decreasing the first applied power and increasing the second applied power, wherein the second applied power is greater than the first applied power; and re-adjusting the first applied power and the second applied power, by decreasing the second applied power and increasing the first applied power, wherein the first applied power is greater than the second applied power, wherein the metallic glass film comprises a binary alloy, and wherein the first material is Ni and the second material is Al.

2. The method of claim 1, wherein the metallic glass film comprises an average atomic composition of 50% the first material and 50% of the second material.

3. The method of claim 1, wherein the metallic glass film comprises a second material composition that varies from 80% to 20% to 80% over each layer.

4. The method of claim 1, wherein the metallic glass film is amorphous.

5. The method of claim 1, further comprising annealing the metallic glass film after the desired film thickness is obtained at a temperature between 250 and 400 degrees Celsius, wherein the annealing results in crystallization of the film.

6. The method of claim 1, wherein the metallic glass film comprises a diffusion barrier in a semiconductor device.

7. The method of claim 1, wherein a third target comprising a third material is provided to the sputtering system, wherein the third material is deposited using a third applied power on the substrate, wherein the third applied power is applied to the third target, and wherein the third applied power is adjusted based on the first applied power and second applied power.

* * * * *